(12) United States Patent
Chevallier

(10) Patent No.: US 6,493,270 B2
(45) Date of Patent: *Dec. 10, 2002

(54) LEAKAGE DETECTION IN PROGRAMMING ALGORITHM FOR A FLASH MEMORY DEVICE

(75) Inventor: Christophe J. Chevallier, Palo Alto, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/346,454

(22) Filed: Jul. 1, 1999

(65) Prior Publication Data

US 2002/0145916 A1 Oct. 10, 2002

(51) Int. Cl.[7] .............................................. G11C 16/04
(52) U.S. Cl. ............................ 365/185.33; 365/185.24; 365/185.28
(58) Field of Search ......................... 365/185.33, 185.24, 365/185.28, 185.22

(56) References Cited

U.S. PATENT DOCUMENTS

| 5,317,535 | A | | 5/1994 | Talreja et al. ............... 365/185 |
| 5,434,815 | A | | 7/1995 | Smarandoiu et al. .. 365/189.01 |
| 5,617,350 | A | | 4/1997 | Roohparvar et al. ... 365/185.02 |
| 5,715,193 | A | | 2/1998 | Norman .................. 365/185.02 |
| 6,052,321 | A | * | 4/2000 | Roohparvar ................ 365/201 |
| 6,108,241 | A | | 8/2000 | Chevallier ............. 365/185.33 |

* cited by examiner

*Primary Examiner*—Vu A. Le
(74) *Attorney, Agent, or Firm*—Schwegman, Lundberg, Woessner & Kluth, P.A.

(57) ABSTRACT

Leakage detection in a programming algorithm for a flash memory device. According to one embodiment of the present invention a method includes programming a first flash cell in an array of flash cells in a flash memory device, sequentially selecting flash cells connected to the first flash cell, testing each selected flash cell to determine if the selected flash cell is leaky, and applying a refresh pulse to the selected flash cell if the selected flash cell is leaky. According to another embodiment of the present invention a flash memory device includes an array of flash cells, a program circuit to apply a programming pulse to program a first flash cell in the array, and a control circuit including elements to sequentially select flash cells connected to the first flash cell, test each selected flash cell to determine if the selected flash cell is leaky, and cause the program circuit to apply a refresh pulse to the selected flash cell if the selected flash cell is leaky.

39 Claims, 9 Drawing Sheets

LEAKAGE DETECTION IN PROGRAMMING ALGORITHM FOR A FLASH MEMORY DEVICE

FIELD OF THE INVENTION

The present invention relates generally to memory devices, and more particularly, to leakage detection in a programming algorithm for a flash memory device.

BACKGROUND

Electrically erasable and programmable read-only memory devices having arrays of what are known as flash cells, also called flash EEPROMs or flash memory devices, are found in a wide variety of electrical devices. A flash memory device is typically formed in an integrated circuit. A conventional flash cell, also called a floating gate transistor memory cell, is similar to a field effect transistor, having a channel region between a source and a drain in a substrate and a control gate over the channel region. In addition the flash cell has a floating gate between the control gate and the channel region. The floating gate is separated from the channel region by a layer of gate oxide, and an inter-poly dielectric layer separates the control gate from the floating gate. Both the control gate and the floating gate are formed of doped polysilicon. The floating gate is floating or electrically isolated. The flash memory device has a large number of flash cells in an array where the control gate of each flash cell is connected to a word line and the drain is connected to a bit line, the flash cells being arranged in a grid of word lines and bit lines.

A flash cell is programmed by applying approximately 10 volts to the control gate, between 5 and 7 volts to the drain, and grounding the source and the substrate to induce hot electron injection from the channel region to the floating gate through the gate oxide. The voltage at the control gate determines the amount of charge residing on the floating gate after programming. The charge affects current in the channel region by determining the voltage that must be applied to the control gate in order to allow the flash cell to conduct current between the source and the drain. This voltage is termed the threshold voltage of the flash cell, and is the physical form of the data stored in the flash cell. As the charge on the floating gate increases the threshold voltage increases.

One type of flash memory device includes an array of multi-bit or multi-state flash cells. Multi-state flash cells have the same structure as ordinary flash cells and are capable of storing multiple bits of data in a single cell. A multi-bit or multi-state flash cell has multiple distinct threshold voltage levels over a voltage range. Each distinct threshold voltage level corresponds to a set of data bits, with the number of bits representing the amount of data which can be stored in the multi-state flash cell.

Data is stored in conventional flash memory devices by programming flash cells that have been previously erased. A flash cell is erased by applying approximately −10 volts to the control gate, 5 volts to the source, grounding the substrate and allowing the drain to float. In an alternate method of erasure the control gate is grounded and 12 volts is applied to the source. The electrons in the floating gate are induced to pass through the gate oxide to the source by Fowler-Nordheim tunneling such that the charge in the floating gate is reduced and the threshold voltage of the flash cell is reduced. Flash cells in an array in a flash memory device are grouped into blocks, and the cells in each block are erased together.

A flash cell is read by applying approximately 5 volts to the control gate, approximately 1 volt to the drain, and grounding the source and the substrate. The flash cell is rendered conductive and current in the cell is sensed to determine data stored in the flash cell. The current is converted to a voltage that is compared with one or more reference voltages in a sense amplifier to determine the state of the flash cell. The current drawn by a flash cell being read depends on the amount of charge stored in the floating gate.

The capacity of flash memory devices to store data is gradually being increased by reducing the size and increasing the number of flash cells in each integrated circuit. The reduction in the size of the flash cells renders them more vulnerable to leakage. Leakage is an unwanted loss of charge from the floating gate of a flash cell and may occur for one of several reasons. Data retention may deteriorate as charge slowly drifts out of the floating gate over the 10 to 100 year operating life of the flash memory device. Environmental conditions in which the flash memory device operates, such as temperature, may influence the leakage. The leakage may also occur when the flash cell is disturbed in the following manner. When a flash cell is being programmed, erased, or read, its word line, or bit line, or both, may be coupled to a voltage that is elevated in either a positive or negative direction. Adjacent flash cells sharing the same word line or bit line will also receive the elevated voltage which can disturb voltage differentials between the control gates, drains, and sources of the adjacent flash cells. The disturbance may cause charge to leak from the floating gates of some of the adjacent flash cells. Depending on the array structure multiple cycles of programming or an erase of flash cells in a block could induce leakage in cells in different blocks in the array. If sufficient leakage occurs in a programmed flash cell over its lifetime it may gradually move to a state in which a read operation will indicate that it is erased. This is called a bit failure. As flash cells get smaller and more flash cells are placed in a given area of a silicon chip there is an increased tendency for a flash cell to be disturbed and to suffer leakage.

Accordingly, there exists a need for a method of identifying flash cells that are leaky.

SUMMARY OF THE INVENTION

The above mentioned and other deficiencies are addressed in the following detailed description. According to one embodiment of the present invention a method includes programming a first flash cell in an array of flash cells in a flash memory device, sequentially selecting flash cells connected to the first flash cell, testing each selected flash cell to determine if the selected flash cell is leaky, and applying a refresh pulse to the selected flash cell if the selected flash cell is leaky. According to another embodiment of the present invention a flash memory device includes an array of flash cells, a program circuit to apply a programming pulse to program a first flash cell in the array, and a control circuit including elements to sequentially select flash cells connected to the first flash cell, test each selected flash cell to determine if the selected flash cell is leaky, and cause the program circuit to apply a refresh pulse to the selected flash cell if the selected flash cell is leaky.

Advantages of the present invention will be apparent to one skilled in the art upon an examination of the detailed description.

DETAILED DESCRIPTION

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

In this description a flash cell is described as being activated or switched on when it is rendered conductive by a control gate voltage that exceeds its threshold voltage, and the flash cell is described as being in an inactive state or switched off when the control gate voltage is below the threshold voltage and the flash cell is non-conductive. A digital signal of 1 may also called a high signal and a digital signal of 0 may also called a low signal.

Figure 1:
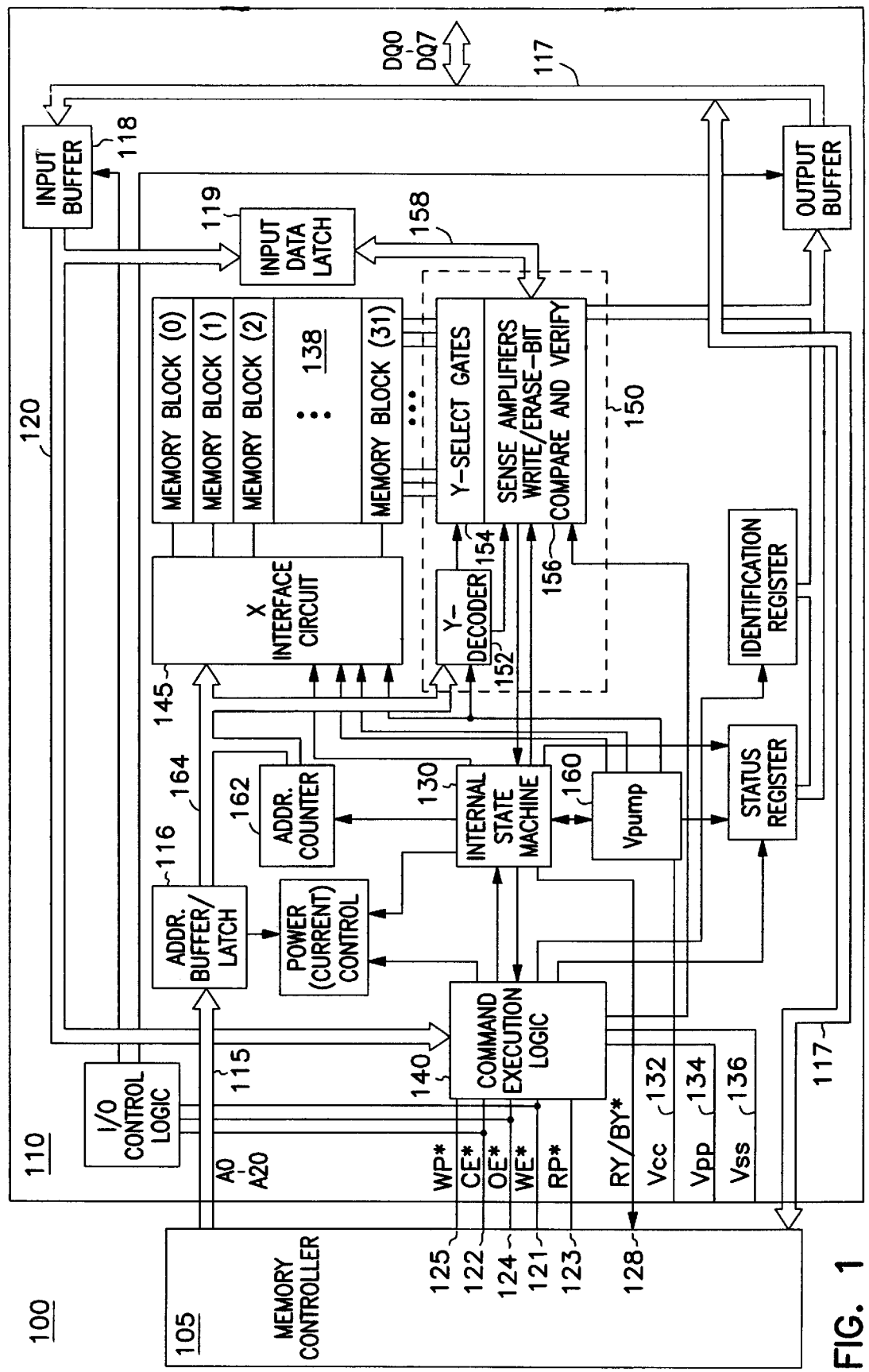
FIG. 1 is a schematic diagram of a flash memory system according to an embodiment of the present invention.

FIG. 1 is a schematic diagram illustrating a flash memory system 100 according to an embodiment of the present invention. The memory system 100 includes a memory controller 105 and a flash memory integrated circuit (IC) 110. The controller 105 includes a control device such as a microprocessor to provide interface signals to the IC 110. The interface signals include address signals provided over multiple address lines 115 to an address buffer and latch 116, and data signals communicated over multiple data lines 117. The data lines 117 are coupled to an input buffer 118 which stores the data signals for transfer to an input data latch 119 over multiple internal data lines 120. Other interface signals provided by the controller 105 include a write enable signal WE* at node 121, a chip enable signal CE* at node 122, a reset/power-down signal RP* at node 123, an output enable signal OE* at node 124, and a write protect signal WP* at node 125, all of which are active low signals. The IC 110 provides a status signal RY/BY* to the controller 105 at node 128 to indicate the status of an internal state machine 130. The IC 110 also receives a positive power supply voltage $V_{cc}$ at node 132, a write/erase supply or programming voltage $V_{pp}$ at node 134, and a reference voltage such as a substrate ground voltage $V_{SS}$ at node 136 which is approximately 0 Volts.

The IC 110 includes an array 138 of floating gate transistor memory cells or flash cells arranged in 32 flash cell blocks. Each block in the array 138 contains 64 kilobytes of flash cells. Flash cells in each block are erased as a group at the same time. A command execution logic module 140 receives the above-described interface signals from the controller 105. The module 140 controls the state machine 130 which controls individual acts necessary for programming, reading, and erasing the flash cells in the array 138. More specifically the state machine 130 controls detailed operations of the IC 110 such as providing write and block erase timing sequences to the array 138 through an X-interface circuit 145 and a Y-interface circuit 150.

The Y-interface circuit 150 provides access to individual flash cells through data lines in the array 138. Data lines in the Y-interface circuit 150 are connected to a bit line driver circuit (not shown). The Y-interface circuit 150 includes a Y-decoder circuit 152, Y-select gates 154, and sense amplifiers and write/erase bit compare and verify circuits 156. The X-interface circuit 145 provides access to rows of flash cells through word lines in the array 138, which are electrically coupled to the control gates of the flash cells in the array 138. The X-interface circuit 145 includes decoding and control circuits for erasing the blocks of flash cells in the array 138. The write/erase bit compare and verify circuits 156 are coupled to exchange data with the input data latch 119 over a set of internal data lines 158.

The IC 110 includes a charge pump circuit 160 to generate an elevated voltage Vpump for programming, erasing, or reading the flash cells in the array 138. The pump circuit 160 is coupled to receive the positive power supply voltage $V_{cc}$ from the node 132 and provides the voltage Vpump to the X-interface circuit 145, the Y-decoder circuit 152, and the state machine 130 over a plurality of lines. In an alternate embodiment of the present invention, the pump circuit 160 may provide a different elevated voltage over each of the lines shown in FIG. 1. The state machine 130 controls an address counter 162 which is capable of providing a sequence of addresses on an internal set of address lines 164 coupled between the address buffer and latch 116, the X-interface circuit 145, and the Y-decoder circuit 152.

Figure 2:
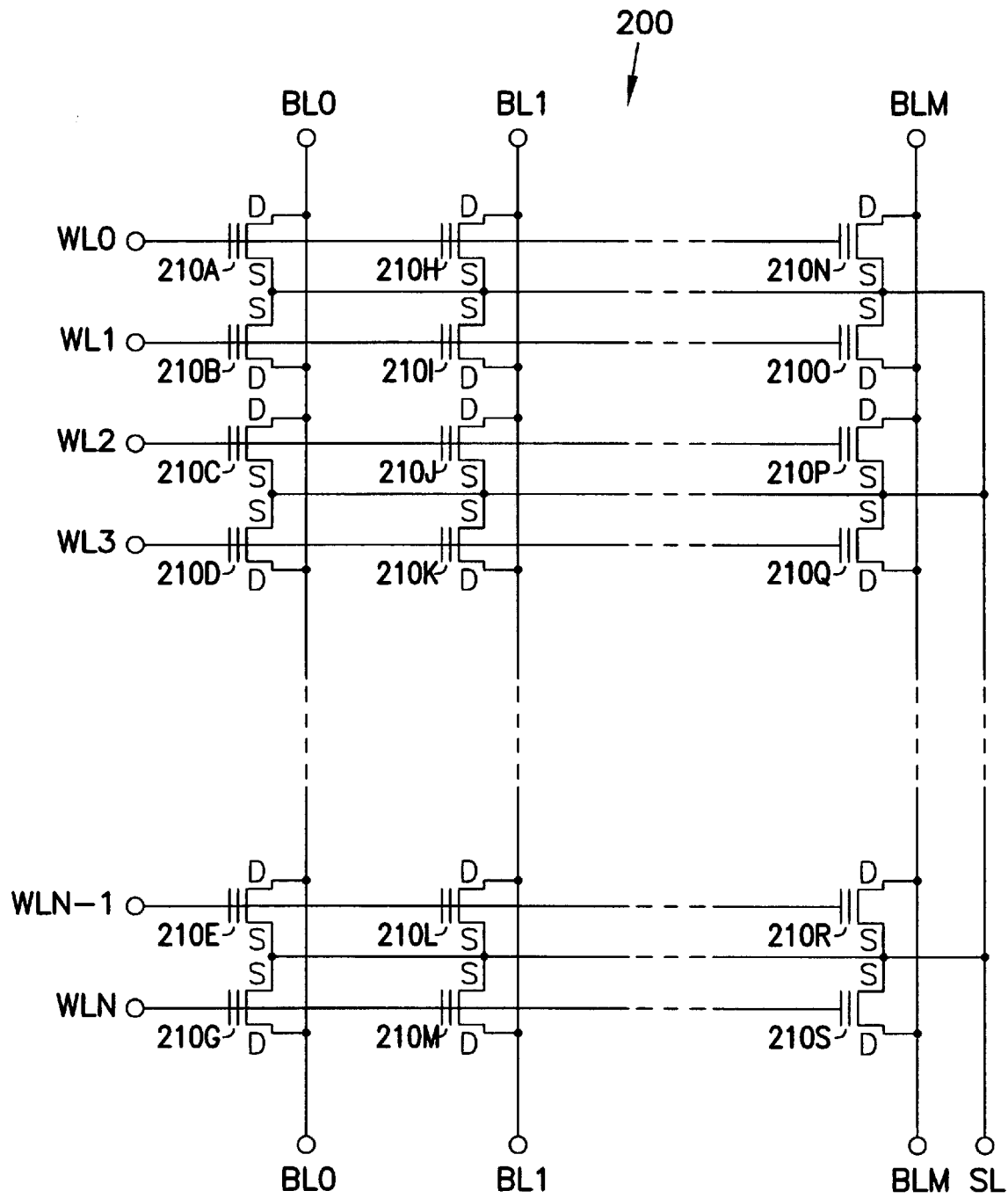
FIG. 2 is a schematic diagram of a block of flash cells in the memory system of FIG. 1.

FIG. 2 is an electrical schematic diagram of a block 200 of flash cells 210A–210S in the array 138 according to the embodiments of the present invention. Some flash cells in the block 200 are omitted from FIG. 2 for purposes of clarity. The flash cells 210 are arranged in rows and columns. All of the flash cells 210 in a particular column have drains D connected to a common bit line BL and all of the flash cells 210 in a particular row have control gates connected to a common word line WL. The bit lines BL are identified as BL0–BLM and the word lines WL are identified as WL0–WLN. All of the flash cells 210 in the block 200 have sources S connected to a common source line SL. The remaining flash cells in the array 138 are arranged into separate blocks having separate source lines. The flash cells in different blocks are erased independently to reduce the required erase current.

The flash cells 210 are arranged in column pairs, with each flash cell 210 of the pair sharing a common source S. For example, a flash cell pair 210J and 210K have a common source S connected to the source line SL. The drains D of the flash cells 210 are connected to the bit line BL associated with the column in which the flash cells 210 are located. For example, the flash cell pair 210J and 210K have their drains D connected to a common bit line BL1.

A selected one of the flash cells 210A–210S in the block 200 is programmed according to the embodiments of the present invention by holding the source line SL to ground or zero volts, coupling approximately 5–7 volts to the bit line BL connected to the flash cell, and applying a high positive voltage programming pulse of approximately 10 volts to the word line WL of the flash cell. In this description when a programming pulse is described as being applied to a flash cell one skilled in the art will understand that the flash cell is being programmed according to the above-described method.

A selected one of the flash cells 210A–210S in the block 200 is read according to the embodiments of the present invention by holding the source line SL to ground, coupling approximately 1 volt to the bit line BL connected to the flash cell, applying approximately 5.4 volts to the word line WL of the flash cell, and sensing current in the flash cell through the bit line BL. The current is sensed by one of the sense amplifiers 156 that is coupled to the bit line BL. The sensed current is inversely related to the threshold voltage of the flash cell. The higher the threshold voltage, the less current is sensed in the flash cell, and visa versa.

The flash cells 210A–210S in the block 200 are erased according to the embodiments of the present invention by holding the word lines WL0–WLN to ground, allowing the bit lines BL0–BLM to float, and applying a high positive voltage erase pulse of approximately 12 volts to the sources S through the source line SL. Charge is removed from the floating gate of the flash cell when it is erased.

The term pulse is used in a broad sense in this description, referring to the application of a selected voltage level to a terminal for a finite time period. Those skilled in the art having the benefit of this description will understand that a single pulse such as an erase pulse may be applied continuously for the finite time period, or may include a series of shorter discrete pulses applied in sequence and having a summed or total time period equal to the finite time period.

In the embodiments of the present invention described herein a flash cell is deemed to be erased if it has a threshold voltage of less than approximately 3 volts. A flash cell is deemed to be programmed if it has a threshold voltage of greater than approximately 5 volts. A flash cell is read by applying 5.4 volts to its control gate to ensure that it is switched on. The amount of current in the channel region of the flash cell indicates its threshold voltage. A flash cell that is leaking charge from its floating gate, or has suffered unwanted charge loss or leakage, is a leaky flash cell. The leaky flash cell may be refreshed or repaired by a programming pulse, also called a refresh pulse, which adds charge to the floating gate. A repaired flash cell has the threshold voltage of a programmed flash cell. Only a programmed flash cell can be identified as being leaky. An erased flash cell will not be identified as being leaky because its threshold voltage will remain less than approximately 3 volts even if it is losing charge from its floating gate, and the data it is storing will not change.

Figure 3:
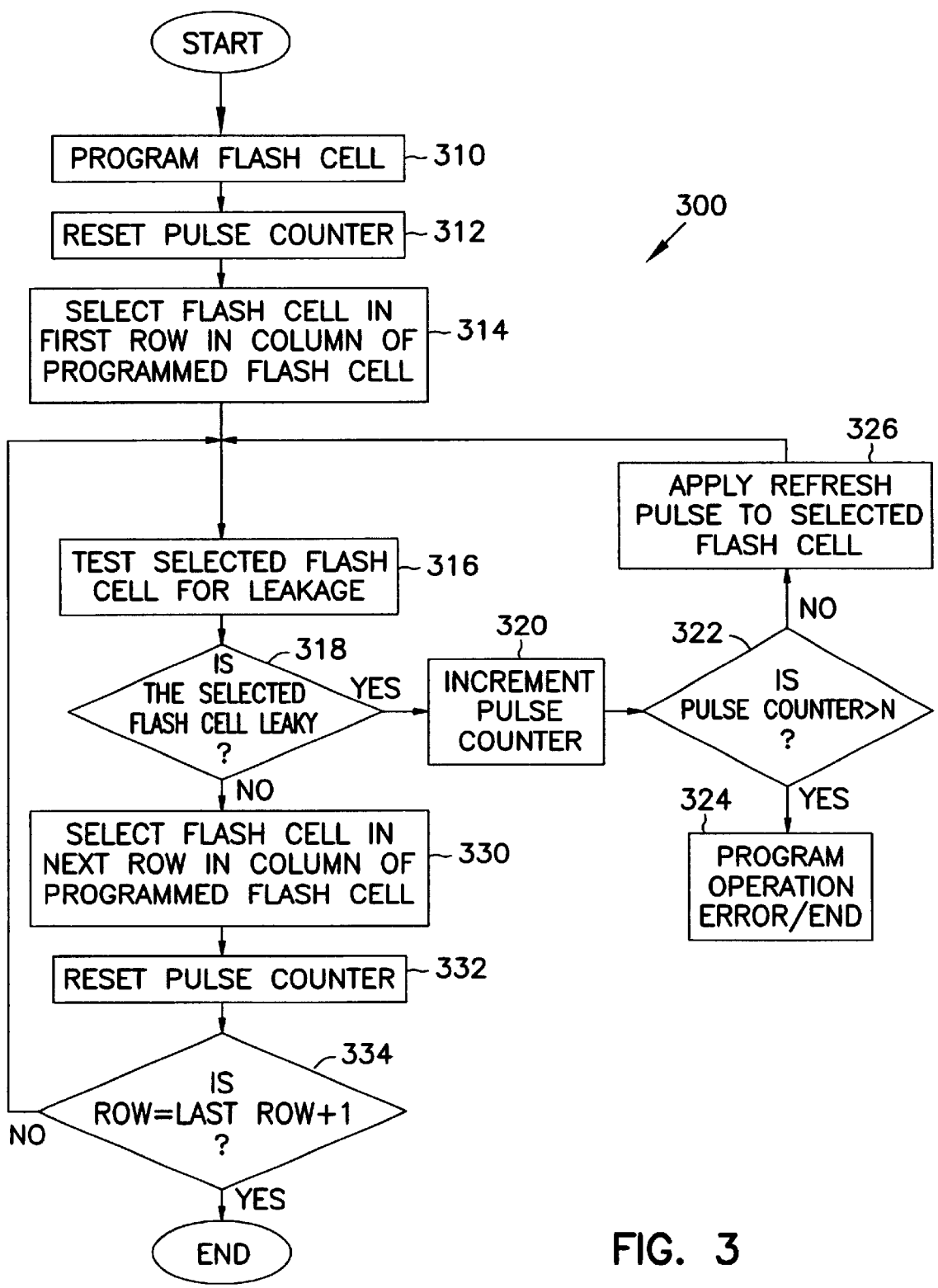
FIG. 3 is a flow chart of a method for programming flash cells and for detecting leaky flash cells according to an embodiment of the present invention.

A method 300 for programming flash cells and for detecting leaky flash cells in the array 138 is shown in FIG. 3. As described above, when a flash cell is programmed flash cells sharing the same word line or bit line are exposed to an elevated voltage which can disturb voltage differentials between the control gates, drains, and sources of the flash cells, and the disturbance can cause leakage in these flash cells. In the method 300 a flash cell is programmed, each of the flash cells in the same column is checked for leakage, and refresh pulses are applied to the leaky flash cells. In 310 a flash cell in the array 138 is programmed in a manner that will be more fully described below. A pulse counter is reset in 312, and a flash cell in a first row of the column including the programmed flash cell is selected in 314. The selected flash cell is then tested for leakage in 316 in a manner that will be more fully described below. The method determines whether the selected flash cell is leaky in 318, and if it is leaky the pulse counter is incremented in 320, the method checks the pulse counter in 322, and if the pulse counter is greater than a selected limit N, indicating that too many refresh pulses have been applied to the selected flash cell, the method 300 ends with an error in 324. The error in 324 indicates that the selected flash cell has failed. If the pulse counter is less than or equal to N a refresh pulse is applied to the selected flash cell in 326 and the acts 316–326 are repeated until the threshold voltage of the selected flash cell is raised sufficiently or until the error in 324 occurs. If in 318 it is determined that the selected flash cell is not leaky, a new flash cell in the next row of the column including the programmed flash cell is selected in 330 and the pulse counter is reset in 332. The method 300 determines in 334 whether the row of the newly selected flash cell is beyond the last row in the column, and if so the method 300 ends. If the newly selected flash cell is in a row of the column then the acts 316–326 are carried out for the newly selected flash cell. The method 300 tests all the flash cells in the column for leakage, including the programmed flash cell. The tested flash cells are in the same column but may be connected to different source lines in different erase blocks. The method 300 identifies flash cells that may have leaked due to the programming of a flash cell in the same column or for any other reason. A refresh pulse is applied to the leaky flash cells to prevent a loss of data. In an alternate embodiment of the present invention, the method 300 may be adapted to test all the flash cells in a row for leakage which are connected to the word line of the programmed flash cell.

Figure 4:
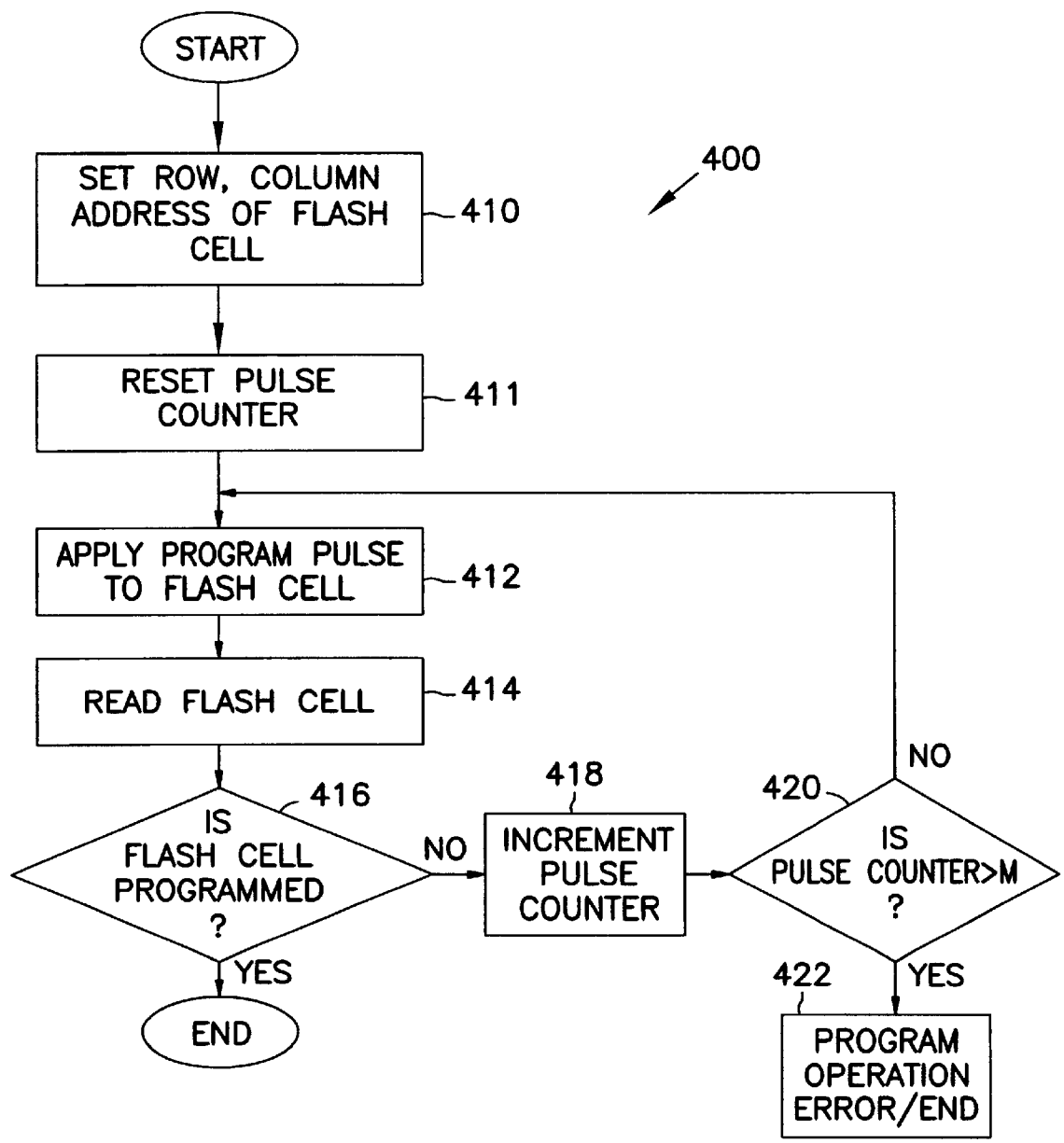
FIG. 4 is a flow chart of a method for programming a flash cell according to an embodiment of the present invention.

A method 400 for programming the flash cell in the array 138 in 310 of the method 300 is shown in FIG. 4 according to an embodiment of the present invention. In 410 a row address and a column address are set for the flash cell to be programmed, and a pulse counter is reset in 411. In 412 a program pulse is applied to the flash cell which is then read in 414, and in 416 the method 400 determines if the flash cell is programmed by evaluating data read from the flash cell in 414. If it is determined that the flash cell is programmed the method 400 ends. If the flash cell is not programmed the pulse counter is incremented in 418 and in 420 the method 400 determines if the pulse counter has exceeded a selected limit M. If the pulse counter is greater than M indicating that too many program pulses have been applied to the flash cell the method 400 ends with an error in 422. The error in 422 indicates that the selected flash cell has failed. If the pulse counter is less than or equal to M the acts 412–422 are repeated until the flash cell is programmed or the error in 422 occurs.

Figure 5:
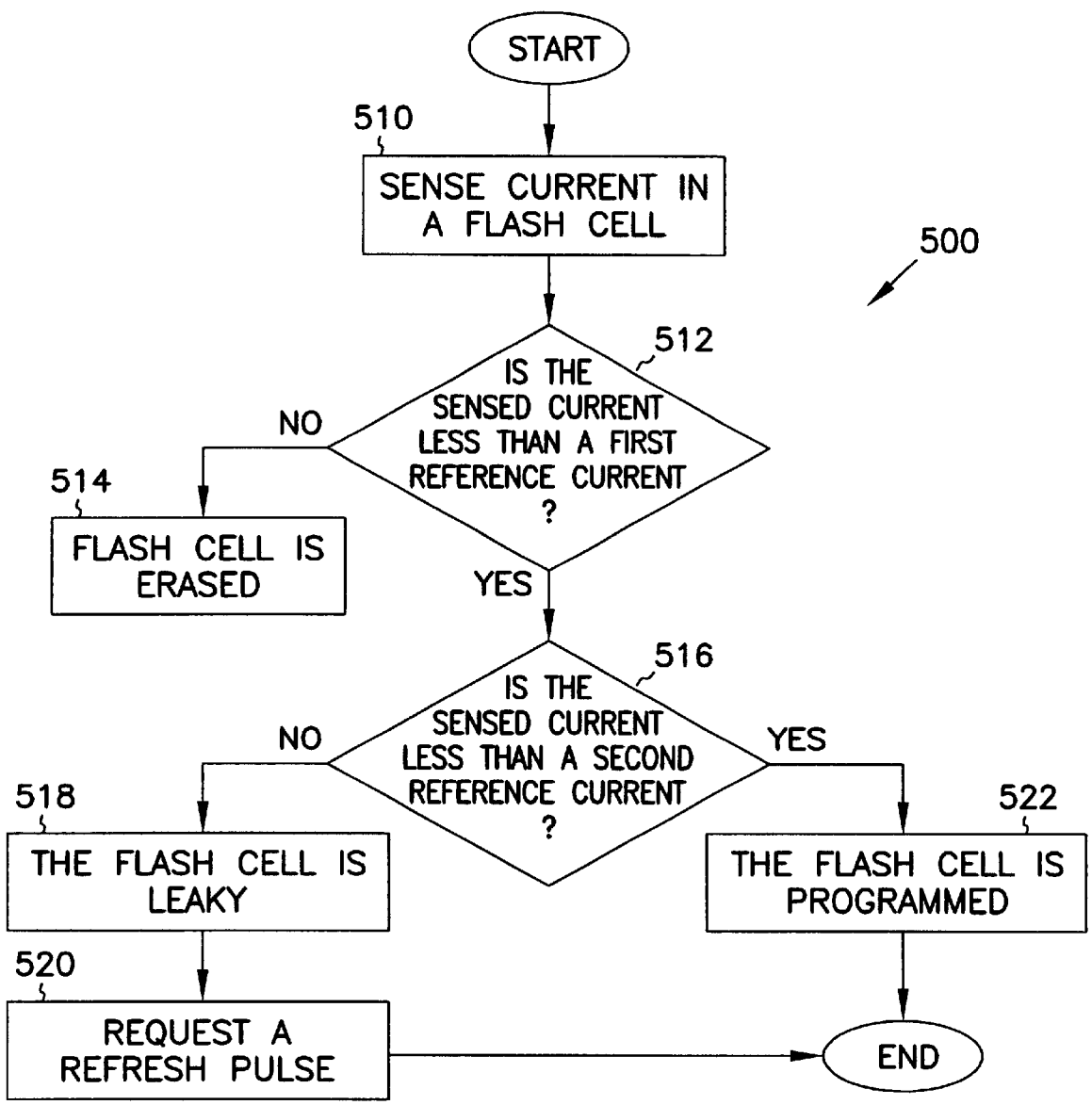
FIG. 5 is a flow chart of a method for identifying a leaky flash cell according to an embodiment of the present invention.

A method 500 for reading flash cells and for identifying leaky flash cells according to an embodiment of the present invention is shown in FIG. 5. The method 500 may be used in 316 of the method 300 to test a flash cell for leakage, and in 414 of the method 400 to read a flash cell. A flash cell is read in 510 by applying approximately 5.4 volts to its control gate and sensing a current in the flash cell. In 512 the sensed current is compared with a first reference current that would be in the flash cell if its threshold voltage were approximately 4 volts. If the sensed current is greater than the first reference current then the flash cell is identified as erased in 514, having a threshold voltage of less than 4 volts. If the sensed current is less than the first reference current then the flash cell has been programmed, having a threshold voltage of greater than 4 volts. The sensed current is then compared with a second reference current in 516 that would be in the flash cell if its threshold voltage were 4.5 volts. The threshold voltage is chosen to be 4.5 volts to indicate whether the floating gate has lost some charge while maintaining its programmed state. If the sensed current is greater than the second reference current, then the flash cell is identified as being leaky in 518 because its threshold voltage has fallen below 4.5 volts due to an unwanted loss of charge from the floating gate. A refresh pulse is requested for the flash cell in 520 to restore its threshold voltage. If the sensed current is less than the second reference current then the flash cell is identified as being programmed and not leaky in 522. Of course, those skilled in the art having the benefit of this description will recognize that other combinations of threshold voltages may be used as reference points for identifying leaky flash cells. The method 500 may be carried out in a single read cycle for a flash memory device such as the IC 110.

Figure 6:
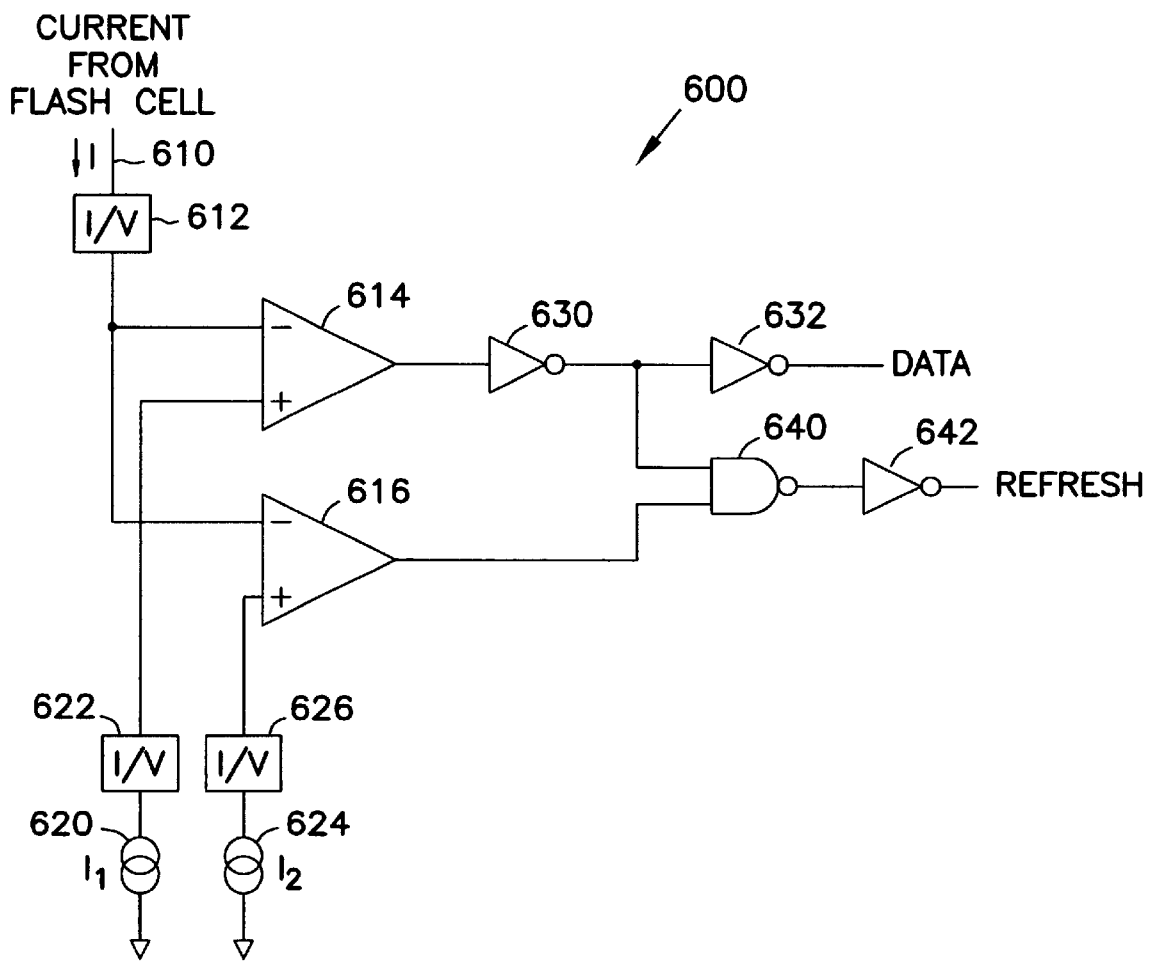
FIG. 6 is an electrical schematic diagram of a circuit for identifying a leaky flash cell according to an embodiment of the present invention.

A circuit 600 for reading flash cells and for identifying leaky flash cells according to an embodiment of the present invention is shown in FIG. 6. The circuit 600 may be used in 316 of the method 300 to test a flash cell for leakage. The circuit 600 is located in the IC 110, and may be in the sense amplifiers 156 shown in FIG. 1. Current I from a flash cell being read is received on a line 610 and is converted to a voltage signal, also called a read signal, by a current to voltage conversion circuit 612. The read signal is coupled to non-inverting inputs of a first sense amplifier 614 and a second sense amplifier 616. In this embodiment of the present invention the first and second sense amplifiers 614, 616 are comparators. A first reference current $I_1$ is generated in a first current source 620 to be approximately equal to current in the flash cell if it had a threshold voltage of 4.0 volts. In one embodiment of the present invention, $I_1$ is 30 microamps. $I_1$ is converted into a first reference signal by a second current to voltage conversion circuit 622 that is coupled to an inverting input of the first sense amplifier 614. A second reference current $I_2$ is generated in a second current source 624 to be approximately equal to current in the flash cell if it had a threshold voltage of 4.5 volts. In one embodiment of the present invention, $I_2$ is 20 microamps. $I_2$ is converted into a second reference signal by a third current to voltage conversion circuit 626 that is coupled to an inverting input of the second sense amplifier 616.

The read signal is compared with the first reference signal in the first sense amplifier 614 to generate a data signal at an output of the first sense amplifier 614. The data signal is inverted by a first inverter 630, and inverted again by a second inverter 632 to output a data signal to the IC 110 indicating whether the flash cell is programmed or erased. The read signal is compared with the second reference signal in the second sense amplifier 616 to determine whether the flash cell is leaky. An output of the second sense amplifier 616 is coupled to one input of a NAND gate 640, and a second input of the NAND gate 640 is connected to an output of the first inverter 630 such that the NAND gate 640 generates a signal at its output that is inverted by a third inverter 642 into a refresh signal indicating whether the flash cell is leaky and needs a refresh pulse. The operation of the circuit 600 may be further described with reference to Table 1:

TABLE 1

| flash cell current I (microamps) | flash cell condition | data signal | refresh signal |
| --- | --- | --- | --- |
| $I > I_1$ | erased | 1 | 0 |
| $I_2 < I < I_1$ | low programmed | 0 | 1 |
| $I < I_2$ | programmed | 0 | 0 |

As shown in Table 1, the circuit 600 operates in the following manner. If I is greater than $I_1$, the threshold voltage of the flash cell is less than 4 volts, it is erased, and the data signal is high. The low inverted data signal is applied to the second input of the NAND gate 640 to ensure that the refresh signal is low and the flash cell does not receive a refresh pulse. When I is less than $I_2$, the threshold voltage of the flash cell is greater than 4.5 volts, it is programmed, and the data signal is low. The output of the second sense amplifier 616 is also low such that the refresh signal is low and the flash cell does not receive a refresh pulse. If I is between $I_1$ and $I_2$, the threshold voltage of the flash cell is between 4 and 4.5 volts and is therefore leaky. In other words, the flash cell has been programmed but has lost charge and its threshold voltage has dropped slightly. The data signal is low but the output of the second sense amplifier is high, so the NAND gate 640 receives two high inputs and generates a high refresh signal from the third inverter 642. When the refresh signal is high a refresh pulse is applied to the flash cell to restore charge to the floating gate and preserve the data stored in the flash cell. An advantage of the circuit 600 is that the address of the flash cell is latched at the time it is read, and the same latched address is used to apply the refresh pulse to the flash cell. No time is spent re-accessing the flash cell for a refresh pulse.

One skilled in the art having the benefit of this description will recognize that the reference currents $I_1$ and $I_2$ will be selected depending on the particular characteristics of the flash cells and the desired reference points around which the flash cells are to be read and tested for leakage.

Figure 7:
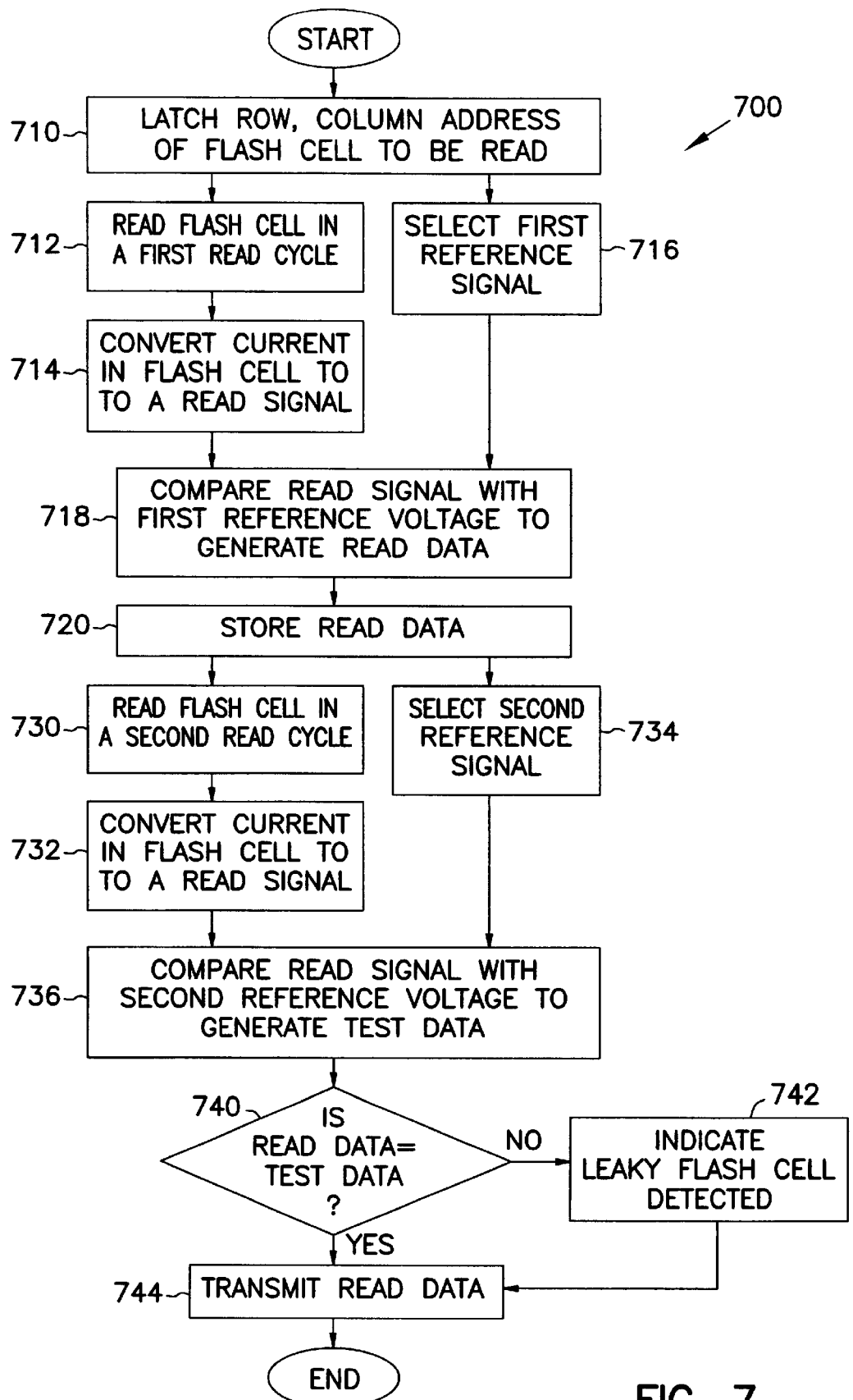
FIG. 7 is a flow chart of a method for identifying a leaky flash cell according to an embodiment of the present invention.

A method 700 for reading a flash cell and for identifying a leaky flash cell in two read cycles according to an embodiment of the present invention is shown in FIG. 7. The method 700 may be used in 316 of the method 300 to test a flash cell for leakage. In 710 a row address and a column address are latched for a flash cell to be read. In 712 the flash cell is read in a first read cycle and in 714 current in the flash cell is converted into a read signal. Either before or during the time the flash cell is read a first reference signal is selected in 716. The read signal is compared with the first reference signal in 718 to generate read data indicating data stored in the flash cell, and the read data is stored in 720. As an example, the first reference signal may be derived from a current that would be in the flash cell if its threshold voltage were 4 volts, as described above with reference to the circuit 600 shown in FIG. 6. In 730 the flash cell is read again in a second read cycle and in 732 current in the flash cell is converted into a read signal. Either before or during the time the flash cell is read a second reference signal is selected in 734. The read signal is compared with the second reference signal in 736 to generate test data indicating data stored in the flash cell. The read data is then compared with the test data in 740 and if the two are not equal then the flash cell is identified as leaky in 742 and the read data is transmitted in 744. If the read data is equivalent to the test data then the read data is transmitted directly in 744. The second reference signal is selected to determine if the threshold voltage of the flash cell has fallen below 5 volts. As an example, the second reference signal may be derived from a current that would be in the flash cell if its threshold voltage were 4.5 volts. The method 700 may be implemented with a single sense amplifier to carry out the comparisons in 718 and 736.

The methods 300, 400, 500, and 700 may be implemented as a series of programmable instructions stored and implemented in the controller 105. The first and second reference signals may be generated by a programmable voltage generator such as the pump circuit 160 in the IC 110. The methods 300, 400, 500, and 700 may also be implemented in the state machine 130. The state machine 130 is a sequential logic circuit including both logic gates and storage elements designed to implement algorithms directly in hardware. The state machine 130 may include logic gates and storage elements to carry out each act of the methods 300, 400, 500, and 700. Other portions of the IC 110 may also be used to implement the methods 300, 400, 500, and 700. For example, the pump circuit 160 may be used to provide the first and second reference signals and any voltages needed to read the flash cell. The flash cell may be read by a sense amplifier in the sense amplifiers 156, and the read data may be stored in the input data latch 119. The methods 300, 400, 500, and 700 may be implemented in other ways known to those skilled in the art having the benefit of this description.

Figure 8:
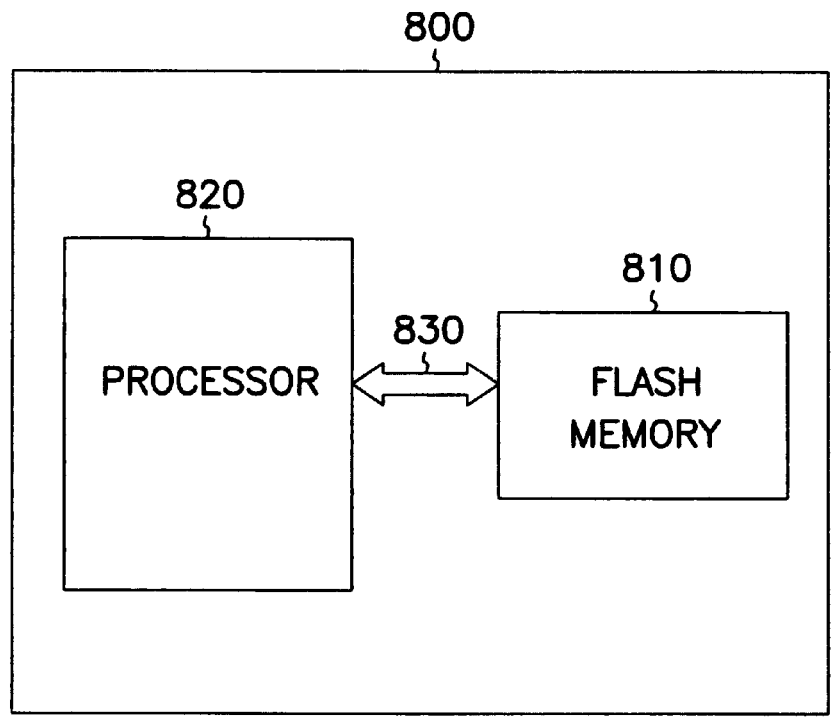
FIG. 8 is a block diagram of an integrated circuit chip according to an embodiment of the present invention.

An integrated circuit chip 800 according to an embodiment of the present invention is shown in FIG. 8. The chip 800 includes an embedded flash memory 810 such as the flash memory integrated circuit 110, and may include the circuit 600, and may implement the methods 300, 400, 500, and 700 according to the embodiments of the present invention described above. The embedded flash memory 810 shares the chip 800 with another integrated circuit 820 such as a processor, or possibly several other integrated circuits. The embedded flash memory 810 and the integrated circuit 820 are coupled together by a suitable communication line or bus 830.

Figure 9:
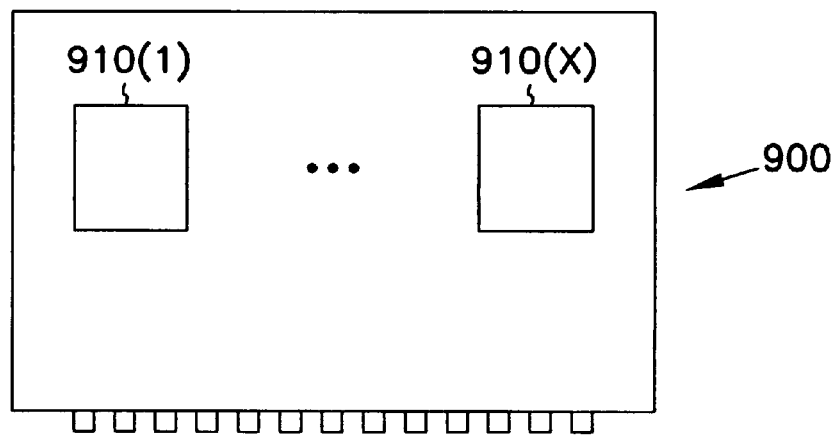
FIG. 9 is block diagram of a compact flash memory card according to an embodiment of the present invention.

One skilled in the art having the benefit of this description will understand that more than one flash memory integrated circuit 110 according to the embodiments of the invention described above may be included in various package configurations. For example, a compact flash memory card 900 according to an embodiment of the present invention is shown in FIG. 9. The card 900 includes a plurality of flash memory integrated circuits 910(1)–910(X) each of which are similar to the flash memory integrated circuit 110 shown in FIG. 1. The card 900 may be a single integrated circuit in which the flash memory integrated circuits 910(1)–910(X) are embedded.

Figure 10:
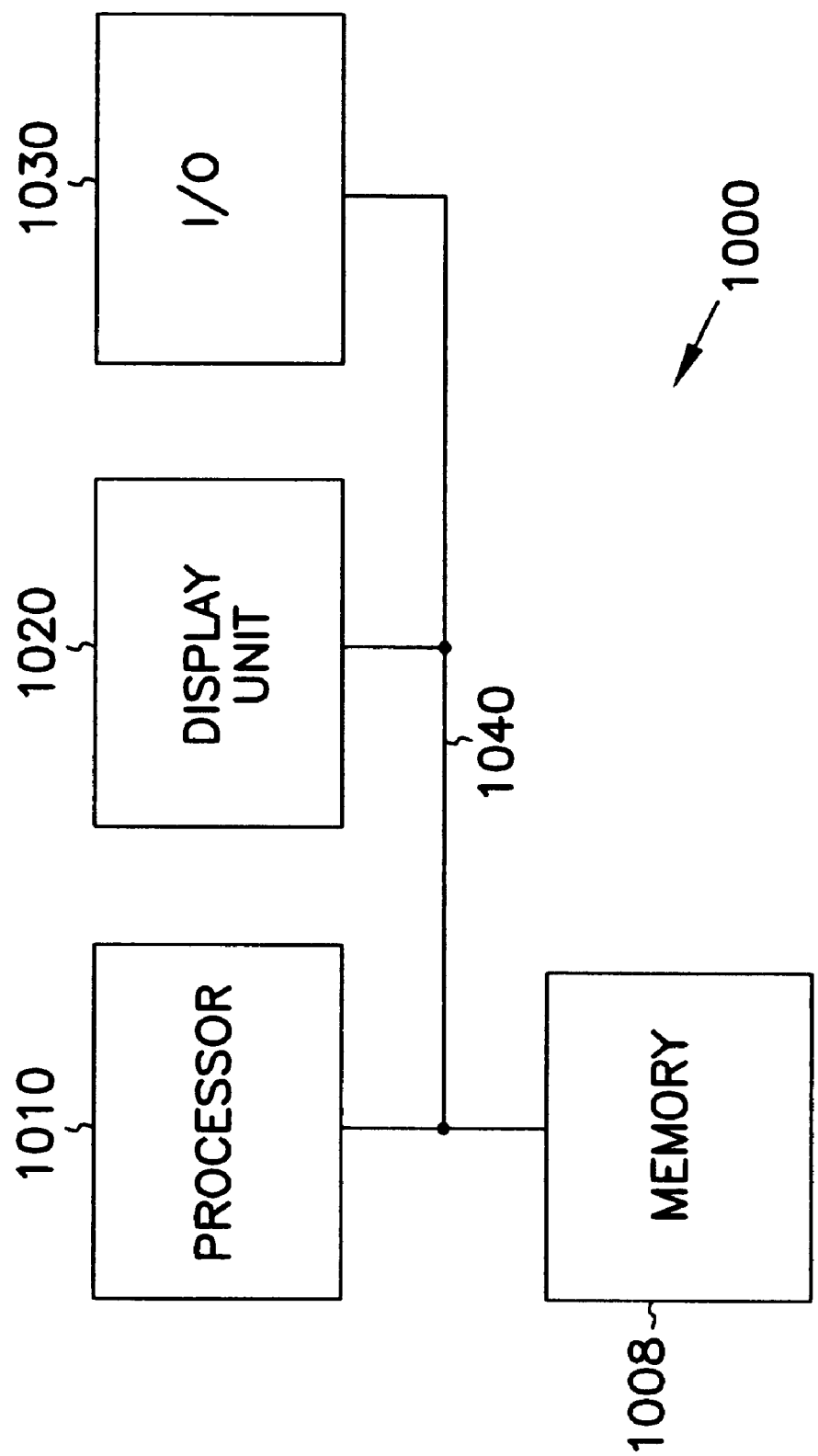
FIG. 10 is a block diagram of an information-handling system according to an embodiment of the present invention.

FIG. 10 is a block diagram of an information-handling system 1000 according to an embodiment of the present invention. The information-handling system 1000 includes a memory system 1008, a processor 1010, a display unit 1020, and an input/output (I/O) subsystem 1030. The processor 1010 may be, for example, a microprocessor. The memory system 1008 is comprised of the flash memory integrated circuit 110, and may include the circuit 600, and may implement the methods 300, 400, 500, and 700 according to the embodiments of the present invention described above. The processor 1010 and the memory system 1008 may be embedded on a single integrated circuit chip such as the chip 800 shown in FIG. 8. The processor 1010, the display unit 1020, the I/O subsystem 1030, and the memory system 1008 are coupled together by a suitable communication line or bus 1040. In various embodiments, the information-handling system 1000 is a computer system (such as, for example, a video game, a hand-held calculator, a television set-top box, a fixed-screen telephone, a smart mobile phone, a personal digital assistant (PDA), a network computer (NC), a hand-held computer, a personal computer, or a multiprocessor supercomputer), an information appliance (such as, for example, a cellular telephone, a pager, or a daily planner or organizer), an information component (such as, for example, a magnetic disk drive or telecommunications modem), or other appliance (such as, for example, a hearing aid, washing machine or microwave oven having an electronic controller).

In the embodiments of the present invention described above a flash cell is programmed, each of the flash cells in the same column is checked for leakage, and refresh pulses are applied to the leaky flash cells. Flash cells that may have leaked due to the programming of a flash cell in the same column or for any other reason are identified, and a refresh pulse is applied to the leaky flash cells to prevent a loss of data.

Although specific embodiments have been illustrated and described herein, it will be appreciated by those skilled in the art having the benefit of this description that any equivalent arrangement may be substituted for the specific embodiments shown. The present invention is therefore limited only by the claims and equivalents thereof.

What is claimed is:

1. A method comprising:

programming a first flash cell in an array of flash cells in a flash memory device;

selecting a second flash cell connected to the first flash cell;

testing the second flash cell to determine if the second flash cell is leaky; and applying a refresh pulse to the second flash cell if the second flash cell is leaky.

2. The method of claim 1 wherein selecting a second flash cell comprises selecting a second flash cell connected to a bit line or a word line that is connected to the first flash cell.

3. The method of claim 1 wherein selecting a second flash cell comprises selecting the first flash cell.

4. The method of claim 1 wherein testing the second flash cell comprises:

reading the second flash cell to generate a read signal;

comparing the read signal with a first reference signal to indicate data stored in the second flash cell; and comparing the read signal with a second reference signal to indicate if the second flash cell is leaky.

5. The method of claim 1, further comprising:

sequentially selecting flash cells connected to a bit line that is connected to the first flash cell;

testing each selected flash cell to determine if the selected flash cell is leaky; and applying a refresh pulse to the selected flash cell if the selected flash cell is leaky.

6. The method of claim 1, further comprising:

testing the second flash cell repeatedly to determine if the second flash cell is leaky;

applying a refresh pulse to the second flash cell each time it is determined that the second flash cell is leaky; and terminating the testing of the second flash cell when it is determined that the flash cell is repaired.

7. The method of claim 6, further comprising:
incrementing a counter each time the refresh pulse is applied to the second flash cell; and
terminating the testing of the second flash cell with an error if the counter exceeds a predetermined value.

8. A method comprising:
programming a first flash cell in an array of flash cells in a flash memory device;
sequentially selecting flash cells connected to the first flash cell;
testing each selected flash cell to determine if the selected flash cell is leaky; and
applying a refresh pulse to the selected flash cell if the selected flash cell is leaky.

9. The method of claim 8 wherein sequentially selecting flash cells comprises sequentially selecting flash cells that are connected to a bit line or a word line that is connected to the first flash cell.

10. The method of claim 8, further comprising:
testing the selected flash cell after each refresh pulse is applied to determine if the selected flash cell is leaky; and
applying a refresh pulse to the selected flash cell if the selected flash cell is leaky.

11. The method of claim 10, further comprising:
resetting a counter when the selected flash cell is selected;
incrementing the counter each time a refresh pulse is applied to the selected flash cell;
terminating the testing of the selected flash cell with an error if the counter exceeds a predetermined value.

12. The method of claim 1 wherein programming a first flash cell further comprises applying a program pulse to the first flash cell and reading the first flash cell to determine if the first flash cell is programmed.

13. The method of claim 8 wherein:
testing each selected flash cell to generate a read signal;
comparing the read signal with a first reference signal to indicate data stored in the selected flash cell; and
comparing the read signal with a first reference signal to indicate data stored in the selected flash cell; and
comparing the read signal with a second reference signal to indicate if the selected flash cell and reading the first flash cell to determine if the first flash cell is programmed.

14. A method comprising:
programming a first flash cell in an array of flash cells in a flash memory device;
selecting a second flash cell connected to a bit line that is connected to the first flash cell;
testing the second flash cell to determine if the second flash cell is leaky; and applying a refresh pulse to the second flash cell if the second flash cell is leaky.

15. The method according to claim 14, further comprising:
sequentially selecting flash cells connected to the bit line that is connected to the first flash cell including selecting the first flash cell;
testing each selected flash cell to determine if the selected flash cell is leaky comprising:
reading the selected flash cell to generate a read signal;
comparing the read signal with a first reference signal to indicate if the selected flash cell is leaky;
comparing the read signal with a second referece signal to indicate if the selected flash cell is leaky;
applying a refresh pulse to the selected flash cell if the selected flash cells is leaky;
repeatedly testing the selected flash cell and applying a refresh pulse to the selected flash cell until the selected flash cell is not leaky or has received more than a selected number of refresh pulses; and
wherein programming a first flash cell further comprises applying a program pulse to the first flash cell and reading the first flash cell to determine if the first flash cell is programmed.

16. A method comprising:
programming a first flash cell in an array of flash cells in a flash memory device;
selecting a second flash cell connected to a word line that is connected to the first flash cell;
testing the second flash cell to determine if the second flash cell is leaky; and
applying a refresh pulse to the second flash cell if the second flash cell is leaky.

17. The method of claim 16, further comprising:
sequentially selecting flash cells connected to the word line that is connected to the first flash cell including selecting the first flash cell;
testing each selected flash cell to determine if the selected flash cell is leaky comprising:
reading the selected flash cell to generate a read signal;
comparing the read signal with a first reference signal to indicate data stored in the selected flash cell; and
comparing the read signal with a second reference signal to indicate if the selected flash cell is leaky;
applying a refresh pulse to the selected flash cell if the selected flash cell is leaky;
repeatedly testing the selected flash cell and applying a refresh pulse to the selected flash cell until the selected flash cell is not leaky or has received more than a selected number of refresh pulses; and
wherein programming a first flash cell further comprises applying a program pulse to the first flash cell and reading the first flash cell to determine if the first flash cell is programmed.

18. A method comprising:
programming a first flash cell in an array of flash cells in a flash memory device;
sequentially selecting flash cells to a bit line that is connected to the first flash cell;
testing each selected flash cell to determine if the selected flash cell is leaky; and
applying a refresh pulse to the selected flash cell if the selected flash cell is leaky.

19. The method according to claim 18, further comprising:
repeatedly testing the selected flash cell and applying a refresh pulse to the selected flash cell until the selected flash cell is not leaky or has received more than a selected number of refresh pulses; and
wherein testing each selected flash cell comprises;
reading the selected flash cell to generate a read signal;
comparing the read signal with a first reference signal to indicate data stored in the selected flash cell; and
comparing the read signal with a second reference signal to indicate if the selected flash cell is leaky; and
wherein programming a first flash cell further comprises applying a program pulse to the first flash cell and reading the first flash cell to determine if the first flash cell is programmed.

20. A method comprising:
programming a first flash cell in an array of flash cells in a flash memory device;
sequentially selecting flash cells connected to a word line that is connected to the first flash cell;
testing each selected flash cell to determine if the selected flash cell is leaky; and
applying a refresh pulse to the selected flash cell if the selected flash cell is leaky.

21. The method of claim 20, further comprising:
repeatedly testing the selected flash cell and applying a refresh pulse to the selected flash cell until the selected flash cell is not leaky or has received more than a selected number of refresh pulses; and
wherein testing each selected flash cell comprises:
reading the selected flash cell to generate a read signal;
comparing the read signal with a first reference signal to indicate data stored in the selected flash cell; and
comparing the read signal with a second reference signal to indicate if the selected flash cell is leaky; and
wherein programming a first flash cell further comprises applying a program pulse to the first flash cell and reading the first flash cell to determine if the first flash cell is programmed.

22. A method of operating a system comprising:
exchanging signals between a memory controller and a flash memory device;
programming a first flash cell in an array of flash cells in the flash memory device;
selecting a second flash cell connected to the first flash cell;
testing the second flash cell to determine if the second flash cell is leaky; and
applying a refresh pulse to the second flash cell if the second flash cell is leaky.

23. The method of claim 22 wherein exchanging signals further comprises exchanging signals between a processor or a microprocessor and the flash memory device embedded in a single integrated circuit chip.

24. The method of claim 22, further comprising:
sequentially selecting flash cells connected to a bit line or a word line that is connected to the first flash cell including selecting the first flash cell;
testing each selected flash cell to determine if the selected flash cell is leaky comprising:
reading the selected flash cell to generate a read signal;
comparing the read signal with a first reference signal to indicate data stored in the selected flash cell; and
comparing the read signal with a second reference signal to indicate if the selected flash cell is leaky;
applying a refresh pulse to the selected flash cell if the selected flash cell is leaky;
repeatedly testing the selected flash cell and applying a refresh pulse to the selected flash cell until the selected flash cell is not leaky or has received more than a selected number of refresh pulses; and
wherein exchanging signals further comprises exchanging address signals, data signals, a chip enable signal, a write enable signal, a reset/power-down signal, an output enable signal, a write protect signal, and a status signal between the memory controller and the flash memory device over a bus; and wherein programming a first flash cell further comprises applying a program pulse to the first flash cell and reading the first flash cell to determine if the first flash cell is programmed.

25. A method of operating a system comprising:
exchanging signals between a memory controller and a flash memory device;
programming a first flash cell in an array of flash cells in the flash memory device;
selecting a second flash cell connected to a bot line that is connected to the first flash cell;
testing the second flash cell to determine if the second flash cell is leaky; and
applying a refresh pulse to the second cell if the second flash cell is leaky.

26. The method of claim 25 wherein exchanging signals further comprises exchanging signals between a processor or a microprocessor and the flash memory device embedded in a single integrated circuit chip.

27. The method of claim 25, further comprising:
sequentially selecting flash cells connected to the bit line that is connected to the first flash cell including selecting the first flash cell;
testing each selected flash cell to determine if the selected flash cell is leaky comprising:
reading the selected flash cell to generate a read signal;
comparing the read signal with a first reference signal to indicate data stored in the selected flash cell; and
comparing the read signal with a first reference signal to indicate if the selected flash cell is leaky;
applying a refresh pulse to the selected flash cell if the selected flash cell is leaky;
repeatedly testing the selected flash cell and applying a refresh pulse to the selected flash cell until the selected flash cell is not leaky or has received more than a selected number of refresh pulses; and
wherein exchanging signals further comprises exchanging address signals, data signals, a chip enable signal, a write enable signal, a reset/power-down signal, an output enable signal, a write power signal, and a status signal between the memory controller and the flash memory device over a bus; and
wherein programming a first flash cell further comprises applying a program pulse to the first flash cell and reading the first flash cell to determine if the first flash cell is programmed.

28. A method of operating a system comprising:
exchanging signals between a memory controller and a flash memory device;
programming signals between a memory controller and a flash memory device;
selecting a second flash cell connected to a word line that is connected to the first flash cell;
testing the second flash cell to determine if the second flash cell is leaky; and
applying a refresh pulse to the second flash cell if the second flash cell is leaky.

29. The method of claim 28 wherein exchanging signals further comprises exchanging signals between a processor or a microprocessor and the flash memory device embedded in a single integrated circuit chip.

30. The method of claim 28, further comprising:
sequentially selecting flash cells connected to the word line that is connected to the first flash cell including selecting the first flash cell;

testing each selected flash cell to determine if the selected flash cell is leaky comprising:
reading the selected flash cell to generate a read signal;
comparing the read signal with a first reference signal to indicate data stored in the selected flash cell; and
comparing the read signal with a second reference signal to indicate if the selected flash cell is leaky;
applying a refresh pulse to the selected flash cell if the selected flash cell is leaky;
repeatedly testing the selected flash cell and applying a refresh pulse to the selected flash cell until the selected flash cell is not leaky or has received more than a selected number of refresh pulses; and
wherein exchanging signals further comprises exchanging address signals, data signals, a chip enable signal, a write enable signal, a reset/power-down signal, an output enable signal, a write protect signal, and a status signal between the memory controller and the flash memory device over a bus; and
wherein programming a first flash cell further comprises applying a program pulse to the first flash cell and reading the first flash cell to determine if the first flash cell is programmed.

31. A method of operating a system comprising:
exchanging signals between a memory controller and a flash memory device;
programming a first flash cell in an array of flash cells in the flash memory device;
sequentially selecting flash cells connected to the first flash cell;
testing each selected flash cell to determine if the selected flash cell is leaky; and
applying a refresh pulse to the selected flash cell if the selected flash cell is leaky.

32. The method of claim 31 wherein exchanging signals further comprises exchanging signals between a processor or a microprocessor and the flash memory device embedded in a single integrated circuit chip.

33. The methof of claim 31, further comprising:
repeatedly testing the selected flash cell and applying a refresh pulse to the selected flash cell until the selected flash cell is not leaky or has received more than a selected number of refresh pulses; and
wherein sequentially selecting flash cells further comprises sequentially selecting flash cells connected to a bit line or a word line that is connected to the first flash cell including selecting the first flash cell;
wherein exchanging signals further comprises exchanging address signals; data signals, a chip enable signal, a write enable signal, a reset/power-down signal, an output enable signal, a write protect signal, and a status signal between the memory controller and the flash memory device over a bus;
wherein testing each selected flash cell comprises:
reading the selected flash cell to generate a read signal;
comparing the read signal with a first reference signal to indicate data stored in the selected flash cell; and
comparing the read signal with a second reference signal to indicate if the selected flash cell is leaky; and
wherein programming the first flash cell further comprises applying a program pulse to the first flash cell and reading the first flash cell to determine if the first flash cell is programmed.

34. A method of operating a system comprising:
exchanging signals between a memory controller and a flash memory device;
programming a first flash cell in an array of flash cells in the flash memory device;
sequentially selecting flash cells connected to a bit line that is connected to the first flash cell;
testing each selected flash cell to determine if the selected flash cell is leaky; and
applying a refresh pulse to the selected flash cell if the selected flash cell is leaky.

35. The method of claim 34 wherein exchanging signals further comprises exchanging signals between a processor or a microprocessor and the flash memory deivce embedded in a single integrated circuit chip.

36. The method of claim 23, further comprising:
repeatedly testing the selected flash cell and applying a refresh pulse to the selected flash cell until the selected flash cell is not leaky or has received more than a selected number of refresh pulses; and
wherein sequentially selecting flash cells further comprises sequentially selecting flash cells connected to the bit line that is connected to the first flash cell including selecting the first flash cell;
wherein exchanging signals further comprises exchanging address signals, data signals, a chip enable signal, a write enable signal, a reset/power-down signal, an output enable signal, a write protect signal, and a status signal between the memory controller and the flash memory device over a bus;
wherein testing each selected flash cell comprises:
reading the selected flash cell to generate a read signal;
comparing the read signal with a first reference signal to indicate data stored in the selected flash cell; and
comparing the read signal with a second reference signal to indicate if the selected flash cell is leaky; and
wherein programming a first flash cell further comprises applying a program pulse to the first flash cell and reading the first flash cell to determine if the first flash cell is programmed.

37. A method of operating a system comprising:
exchanging signals between a memory controller and a flash memory device;
programming a first flash cell in an array of flash cells in the flash memory device;
sequentially selecting flash cells connected to a word line that is connected to the first flash cell;
testing each selected flash cell to determine if the selected flash cell is leaky; and
applying a refresh pulse to the selected flash cell if the selected flash cell is leaky.

38. The method of claim 37 wherein exchanging signals further comprises exchanging signals between a processor or a microprocessor and the flash memory device embedded in a single integrated circuit chip.

39. The method of claim 37, further comprising:
repeatedly testing the selected flash cell and applying a refresh pulse to the selected flash cell until the selected flash cell is not leaky or has received more than a selected number of refresh pulses; and
wherein sequentially selecting flash cells further comprises sequentially selecting flash cells connected to the word line that is connected to the first flash cell including selecting the first flash cell;

wherein exchanging signals further comprises exchanging address signals, data signals, a chip enable signal, a write enable signal, a reset/power-down signal, an output enable signal, a write protect signal, and a status signal between the memory controller and the flash memory device over a bus;

wherein testing each selected flash cell comprises:
reading the selected flash cell to generate a read signal;
comparing the read signal with a first reference signal to indicate data stored in the selected flash cell; and
comparing the read signal with a recond reference signal to indicate if the selected flash cell is leaky; and wherein programming a first flash cell further comprises applying a program pulse to the first flash cell and reading the first flash cell to determine if the first flash cell is programmed.

* * * * *

UNITED STATES PATENT AND TRADEMARK OFFICE
CERTIFICATE OF CORRECTION

PATENT NO. : 6,493,270 B2
DATED : December 10, 2002
INVENTOR(S) : Christophe J. Chevallier It is certified that error appears in the above-identified patent and that said Letters Patent is hereby corrected as shown below:

Column 3,
Line 48, delete "may" and insert -- is --, therefor.
Line 49, delete "may" and insert -- is --, therefor.

Column 7,
Line 35, insert -- The current to voltage conversion circuit 612 generates a low read signal if the current I is high, and a high read signal if the current I is low.-- after "612.".
Line 36, delete "non-inverting" and insert -- inverting -- therefor.
Line 45, delete "an inverting" and insert -- a non-inverting -- therefor.
Line 52, delete "an inverting" and insert -- a non-inverting -- therefor.

Column 11,
Line 38, insert -- further comprises: reading the selected flash cell -- after "cell".
Line 41, delete second instance of "comparing the read signal with a first reference signal to indicate data stored in the selected flash cell; and".
Line 44, insert -- is leaky; and programming a first flash cell further comprises applying a program pulse to the first flash cell --, after "cell".
Line 55, delete "according to" and insert -- of -- therefor.
Line 65, delete "if the selected flash cell is leaky;" and insert -- data stored in the selected flash cell; and -- therefor.

Column 12,
Line 2, delete "cells" and insert -- cell -- therefor.
Line 46, insert -- connected -- after "cells".
Line 53, delete "according to" and insert -- of --, therefor.

Column 14,
Line 10, delete "bot" and insert -- bit --, therefor.
Line 14, insert -- flash -- before "cell".
Line 30, delete "first" and insert -- second --, therefor.
Line 41, delete "power" and insert -- protect --, therefor.
Line 51, delete "signals between a memory controller and a flash memory device" and insert -- a first flash cell in an array of flash cells in the flash memory device --, therefor.

UNITED STATES PATENT AND TRADEMARK OFFICE
CERTIFICATE OF CORRECTION

PATENT NO. : 6,493,270 B2
DATED : December 10, 2002
INVENTOR(S) : Christophe J. Chevallier It is certified that error appears in the above-identified patent and that said Letters Patent is hereby corrected as shown below:

Column 15,
Line 41, delete "methof " and insert -- method --, therefor.

Column 16,
Line 18, delete "claim 23" and insert -- claim 34 --, therefor.

Signed and Sealed this

Twenty-sixth Day of August, 2003

JAMES E. ROGAN
*Director of the United States Patent and Trademark Office*